United States Patent [19]

Figura et al.

[11] Patent Number: 5,058,138
[45] Date of Patent: Oct. 15, 1991

[54] MODULAR RECEIVER FOR SIGNALS HAVING MULTIPLE CHANNELS AND MULTIPLE FORMATS

[75] Inventor: John A. Figura, St. Peters, Harry Eidelman, St. Louis, both of Mo.

[73] Assignee: Pacesetter Electronics, Inc., St. Louis, Mo.

[21] Appl. No.: 464,968

[22] Filed: Jan. 16, 1990

[51] Int. Cl.[5] .......................... H04B 1/16; H04B 1/50
[52] U.S. Cl. ........................................ 375/88; 375/75; 375/97; 455/17; 455/182; 370/69.1; 370/120
[58] Field of Search ................. 375/75, 87, 97, 88, 375/8; 370/69.1, 70, 50, 85.9, 120, 122, 123; 455/17, 53, 182, 183, 260, 265, 316, 349; 361/380, 390, 392, 393, 394, 395, 422; 329/300, 301, 304, 311, 315

[56] References Cited

U.S. PATENT DOCUMENTS

| | | | |
|---|---|---|---|
| 3,196,353 | 7/1965 | White et al. | 455/53 |
| 3,299,403 | 1/1967 | Young | 361/393 |
| 3,789,143 | 1/1974 | Blackmer | 375/107 |
| 3,903,485 | 9/1975 | Dolby | 455/72 |
| 3,978,409 | 8/1976 | Dolby et al. | 455/72 |
| 4,048,443 | 9/1977 | Crochiere et al. | 381/37 |
| 4,353,035 | 10/1982 | Schroder | 330/126 |
| 4,519,069 | 5/1985 | Pudsey | 370/85.11 |
| 4,528,656 | 7/1985 | Morais | 370/69.1 |
| 4,596,041 | 1/1986 | Mack | 455/53 |
| 4,600,902 | 7/1986 | Lafferty | 333/14 |
| 4,754,449 | 6/1988 | Crookshanks | 370/70 |
| 4,777,657 | 10/1988 | Gillaspie | 455/300 |
| 4,817,148 | 3/1989 | Lafferty et al. | 380/48 |
| 4,847,863 | 7/1989 | Watson | 375/8 |
| 4,868,891 | 9/1989 | Ide et al. | 455/166 |
| 4,870,863 | 10/1989 | Duncan et al. | 361/394 |

Primary Examiner—Benedict V. Safourek
Assistant Examiner—Young Tse
Attorney, Agent, or Firm—Senniger, Powers, Leavitt & Roedel

[57] ABSTRACT

Disclosed is an apparatus for receiving a selected channel of a signal having a plurality of channels, each channel having a plurality of subchannels. A parabolic reflector, low noise amplifier and block converter receive the signal. A tuner detects the selected channel in the received signal and provides a detected signal corresponding to the selected channel. A demodulator demodulates the detected signal into a baseband signal corresponding to the selected channel, the baseband signal being modulated with the subchannels of the selected channel. An analog bus is connected to the demodulating means for providing the baseband signal. A first demodulator connected to the analog bus demodulates a first subchannel of the subchannels of the baseband signal and provides a signal representative of the first subchannel. A second demodulator connected to the analog bus demodulates a second subchannel of the subchannels of the baseband signal and provides a signal representative of the second subchannel. A digital bus is connected to the first and second demodulators. A power supply is connected to the analog bus and so that the analog bus carries power supply signals to the demodulators. The digital bus carries data in, data out, clock and enable signals to the demodulators.

34 Claims, 5 Drawing Sheets

MODULAR RECEIVER FOR SIGNALS HAVING MULTIPLE CHANNELS AND MULTIPLE FORMATS

BACKGROUND OF THE INVENTION

The invention generally relates to receivers for receiving signals relayed by satellite having multiple channels and multiple formats. In particular, the invention relates to a modular receiver for selectively receiving one or more subchannels of varying formats of a satellite signal.

In order to fully utilize satellites, broadcasters employ satellites having multiple channels, each channel having multiple subchannels. Each subchannel carries various types of information. For example, a subchannel may carry audio information or data or both. Many subscribers have a simultaneous need for information which appears on different subchannels. In the past, such subscribers have employed one receiver for each subchannel which was needed. Of course, this resulted in a significant cost and duplication of hardware.

Many subscribers also have a need for a receiver which can change channels or subchannels upon commands from the broadcasters. In the Past, the broadcasters would program channels or subchannels to meet the particular needs of the subscriber. By Providing a receiver which can be controlled by the broadcaster, the channels or subchannels being received can be changed to fit the particular needs of the subscriber without changing the programming being broadcast by the broadcasters over the separate channels and subchannels.

SUMMARY OF THE INVENTION

It is an object of this invention to provide a receiver for accepting one or more modules which demodulate various channels and/or subchannels having varying frequencies of signals provided to the receiver.

It is another object of this invention to provide a receiver having an analog bus and a digital bus for connection to modules for demodulating baseband signals on the analog bus in accordance with control information on the digital bus.

It is another object of this invention to provide a receiver for accepting modules, one of which is a control module for controlling the operation of the receiver and other modules of the receiver.

It is another object of this invention to provide a receiver having a chassis with a plurality of slots for accepting modules which demodulate various subchannels of signals provided to the receiver.

It is another object of this invention to provide a receiver having a bandwidth, baud rate and frequency of operation controlled by a module therein in response to control information provided on a subchannel of signals provided to the receiver.

It is another, object of this invention to provide a module for use with a receiver for demodulating various subchannels of a signal.

The invention is an apparatus for receiving a selected channel of a signal having a plurality of channels, each channel having a plurality of subchannels. Means receives the signal. Means detects the selected channel in the received signal and provides a detected signal corresponding to the selected channel. Means demodulates the detected signal into a baseband signal corresponding to the selected channel, the baseband signal being modulated with the subchannels of the selected channel (also referred to as FM$^2$). An analog bus is connected to the demodulating means for providing the baseband signal. A first demodulator is connected to the analog bus for demodulating a first subchannel of the subchannels of the baseband signal and provides a signal representative of the first subchannel. A second demodulator is connected to the analog bus for demodulating a second subchannel of the subchannels of the baseband signal and provides a signal representative of the second subchannel.

Other objects and features will be in part apparent and in part pointed out hereinafter.

DETAILED DESCRIPTION OF THE PREFERRED EMBODIMENT

Figures 1, 4:
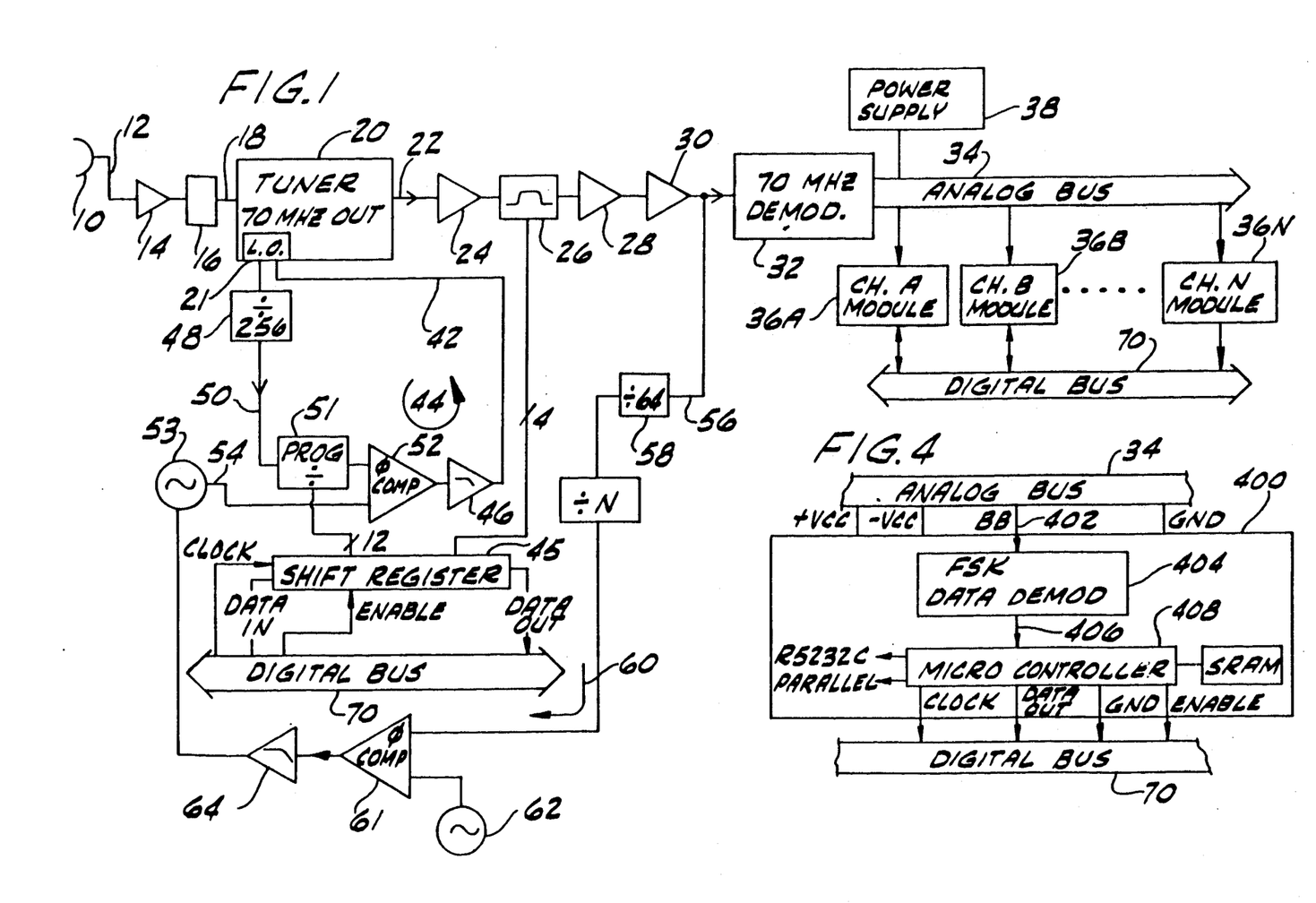
FIG. 1 is a block diagram of the multichannel, multiformat receiver of the invention including N modules connected between the analog and digital buses.
FIG. 4 is a block diagram of a controller module of the invention connected between the analog and digital buses.

In one preferred embodiment of the invention, a receiver as illustrated in FIG. 1 receives multiple channels and multiple formats of signals on the Ku band of a satellite network. The signals consist of primarily DFSK data transmissions from 300 baud rate up to 19,200 baud rate and audio transmissions of from 3.5 khz response to 15 khz response.

Referring to FIG. 1, parabolic reflector 10 receives Ku band signals within the frequency range of from 11.7 ghz to 12.5 ghz. This received signal is provided via line 12 to a low noise amplifier 14 and block converter 16 which conditions the signal. The Ku band signal, after undergoing this signal conditioning, is provided via line 18 to a tuner 20 as a signal within a frequency block of 950 mhz to 1750 mhz. This conditioned signal includes a plurality of channels modulated on various carrier signals, each channel having a plurality of subchannels.

Tuner 20 is tuned to the frequency of the carrier signal of the particular channel which is desired and converts the selected channel into a intermediate frequency signal of 70 mhz provided via line 22. The frequency to which tuner 20 is tuned can be preset at the factory or can be selected via a digital bus 70 and shift register 45 as will be explained below in more detail.

After conditioning by amplifier 24, the tuned signal is provided to a switchable bandwidth band-pass filter 26. The bandwidth can be preset at the factory to be tuned to the bandwidth of the selected channel or can be selected via the digital bus 70 and register 45 as noted below. Thereafter, the signal is conditioned by amplifiers 28 and 30 and provided to a demodulator 32 which demodulates the detected signal into a baseband signal corresponding to the selected channel and being modulated with the subchannels of the selected channel. The baseband signal is then provided to an analog bus 34 for demodulation of its subchannels by one or more modules 36A–36N connected to the analog bus 34. Power to the modules 36A–36N is provided via the analog bus 70 by power supply 38.

In addition to the analog bus 34, each of the modules 36A–36N may be connected to the digital bus 70 which permits digital communication between and among the modules. The purpose and use of the digital bus 70 will be described in more detailed below.

Tuner 20 converts the selected channel into a intermediate frequency of 70 mhz by mixing the block signal with a reference signal controlled via line 42. A first phase lock loop 44 configured for the specific channel selected controls the local oscillator 21 of tuner 20 to generate an isolated signal running at a frequency of 70 mhz above the desired channel. Local oscillator 21 provides its reference signal to the first phase lock loop 44 via a 256:1 divider 48. This generates a divided reference signal provided via line 50 to a programmable divider 51 controlled by a shift register 45 which further divides the signal to a value corresponding to the selected channel. A phase comparator 52 compares the further divided signal to a reference, such as 4.0 mhz signal, provided by oscillator 53 via line 54 to generate a correction signal. The correction signal is provided to the local oscillator 21 of tuner 20 via a low-pass filter 46.

Further enhancing operation of the receiver according to the invention, the IF signal generated by amplifier is also provided via line 56 to a 64:1 divider 58 which divides the IF signal. The divided IF signal is provided via an N divider to a second phase lock loop 60 for automatic frequency control (AFC). Second phase lock loop 60 includes a phase comparator 61 which compares the divided IF signal to a reference signal provided by a crystal oscillator 62. The differdifference in phase between the reference signal and the divided IF signal is provided through a low-pass filter 64 to adjust the frequency of the oscillator 53. This double phase lock loop configuration including loops 44 and 60 compensates for frequency drift which may occur in the low noise amplifier 14 and block converter 16 at the parabolic reflector 10.

As indicated above, loop 44 is configured for the specific channel selected. This configuration can be preset at the factory or can be selected by controlling a frequency synthesizer by shift register 45 via bus 70. Both the frequency of operation of the phase lock loop 44 and the bandwidth of band-pass filter 26 can be controlled via the digital bus 70.

FIG. 1 illustrates an apparatus for receiving a selected channel of a signal, such as provided by a satellite, having a plurality of channels with each channel having a plurality of subchannels. Parabolic reflector 10, low noise amplifier 14 and block convertor 16 constitute means for receiving the signal. Tuner 20 including the first phase lock loop 44 for channel selection and the second phase lock loop 60 for AFC, and the selectable band-pass filter 26 constitute means for detecting the selected channel in the received signal and providing a selected signal, in the form of an IF signal, corresponding to the selected channel. Demodulator 32 constitutes means for demodulating the detected signal into a baseband signal corresponding to the selected channel, the baseband signal being modulated with the subchannels of the selected channel. Channel A module 36A and channel B module 36B constitute first and second demodulators connected to the analog bus for demodulating the baseband signal and for providing a signal representative of first and second subchannels, respectively, of the subchannels of the baseband signal.

Figure 7:
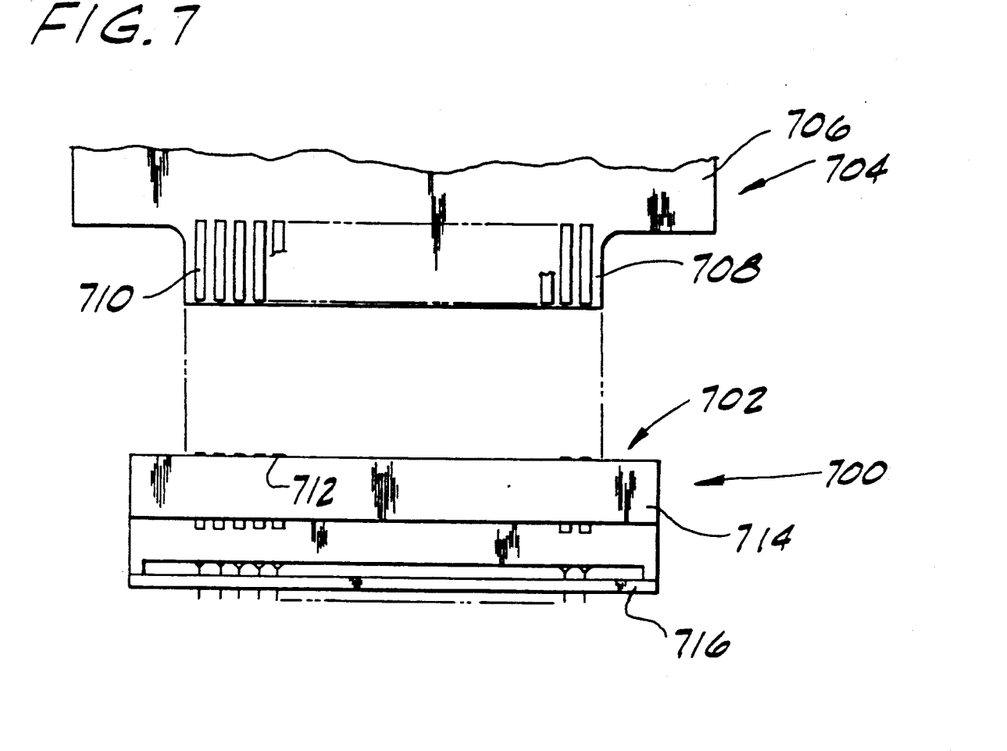
FIG. 7 is a exploded, plan view of one preferred embodiment of a module engaging a slot of a chassis according to the invention.
Figure 8:
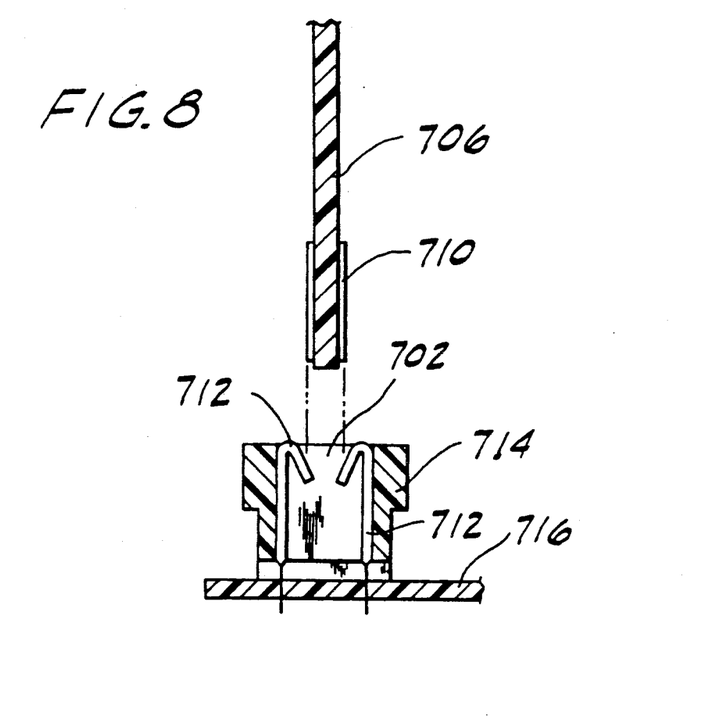
FIG. 8 is a side view of the module of FIG. 7.

As illustrated in FIGS. 7 and 8, in one preferred embodiment of the invention, it is contemplated that the analog and digital buses may be an integral part of a chassis 700 having a plurality of slots 702 therein. Each slot 702 would receive a plug-in module 704 such as a printed circuit board 706 which carries components for demodulating a particular subchannel of the baseband signal provided by the analog bus 70. Each module 704 would be connected to the integral analog/digital bus for receiving signals therefrom and providing signals thereto. Board 706 includes an extended portion 708 having a plurality of conductive tabs 710 thereon which are connected to a printed circuit (not shown) on board 706 to which components for the module are mounted. When the portion 708 is inserted into the slot 702, the tabs 710 contact spring-biased connectors 712 in block 714. Connectors 712 are mounted to board 716 and are connected to a printed circuit (not shown) on the board 716 which is connected to the analog bus 34 and the digital bus 70 Other modular connections will be apparent to those skilled in the art.

Figure 2:
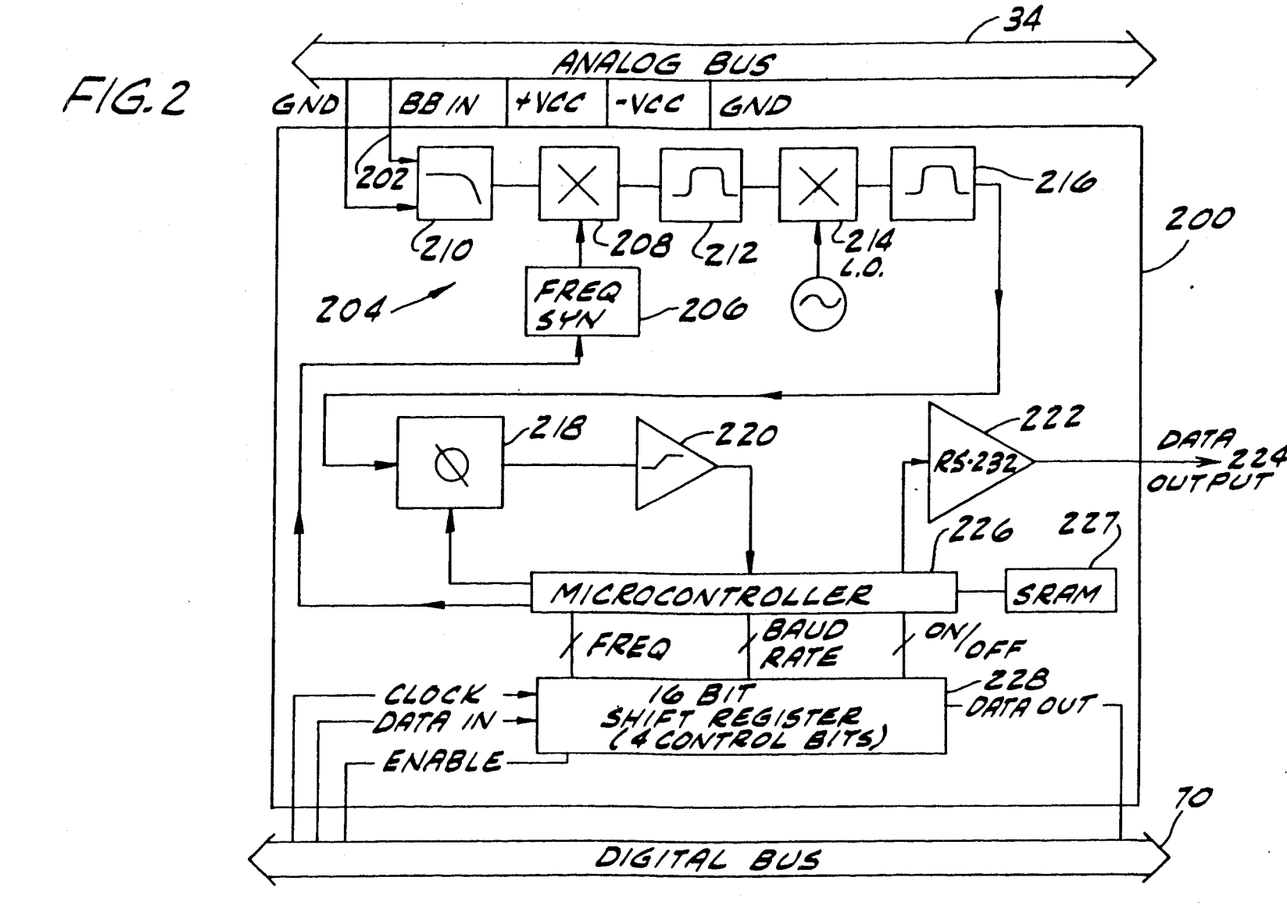
FIG. 2 is a block diagram of a data demodulator module of the invention connected between the analog and digital buses.
Figure 3:
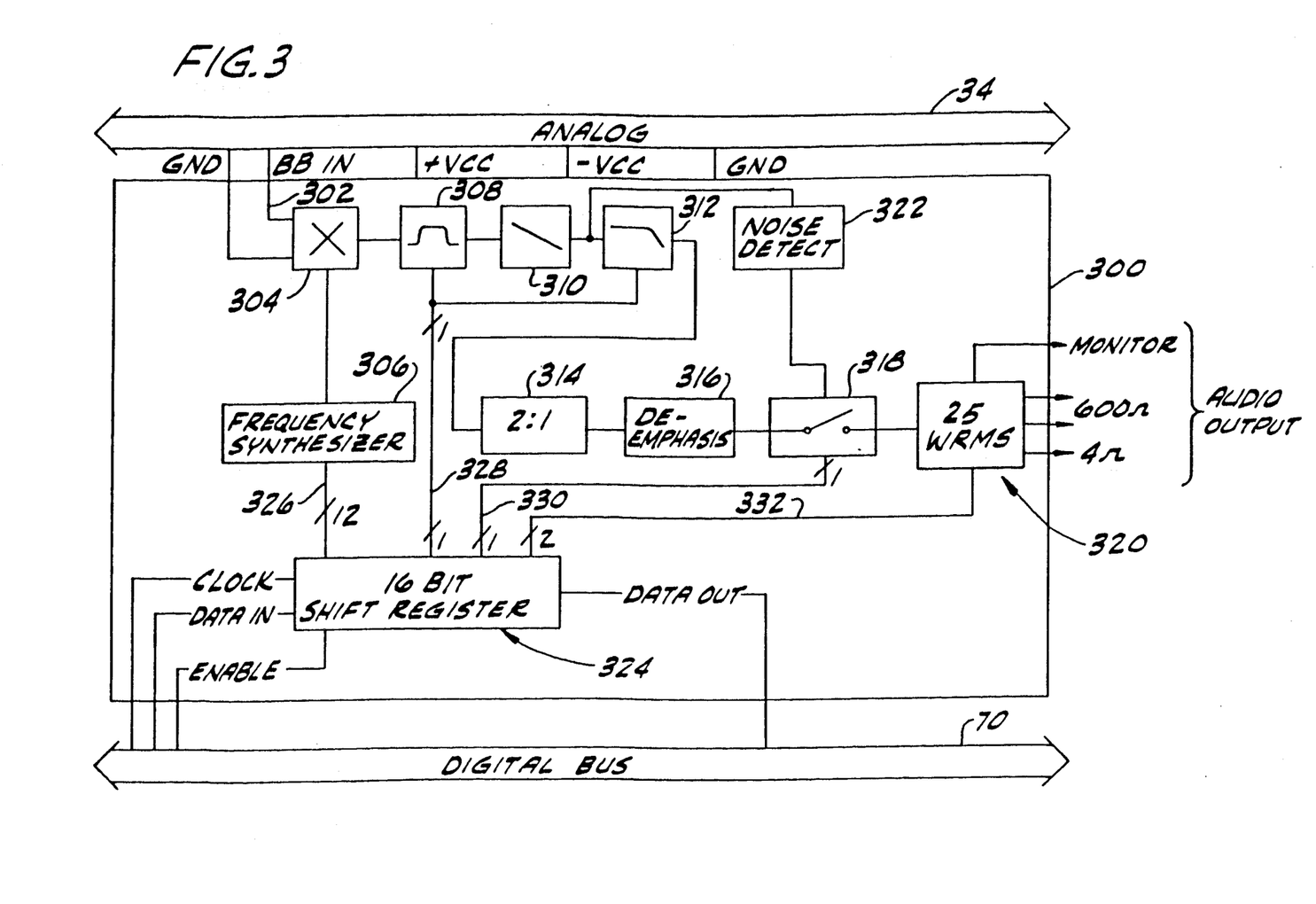
FIG. 3 is a block diagram of a audio demodulator module of the invention connected between the analog and digital buses.

In general, it is contemplated that the receiver may receive multiple formats as well as multiple channels. Accordingly, the module in any one particular slot may be different from the module or modules in other slots in the chassis. There are three types of modules which may be used as channel modules in the slots between the analog bus 34 and the digital bus 70. In order to receive audio subchannels, an audio demodulator module can be used in one of the slots. Alternatively, in order to receive data subchannels, an data demodulator module can be used in one of the slots. Alternatively, in order to receive a control data subchannel, a control data demodulator module can be used in one of the slots. FIGS. 2–4 illustrate these various modules. It is contemplated that modules for receiving different formats may be used simultaneously. For example, a control data demodulator module may be positioned in the channel 1 slot to control register 45 and an audio demodulator module may be positioned in the channel 2 slot, a high speed data demodulator module may be positioned in the channel 3 slot, and a low speed data demodulator module may be positioned in the channel 4 slot. Each module is preset at a default setting so that it will operate at this default setting if the module is not receiving control information from the digital bus 70.

Referring to FIG. 2, a data demodulator module 200 according to the invention is illustrated. As shown, the data demodulator module 200 is connected to both the analog bus 34 and digital bus 70. The baseband signal is provided by analog bus 34 via line 202 to a DFSK asynchronous data demodulator 204. Demodulator 204 may include a programmable frequency synthesizer 206 for generating a local oscillator signal which is mixed by mixer 208 with the baseband signal after filtering by low-pass filter 210. After filtering by band-pass filter 212, the filtered signal is mixed by mixer 214 with a local oscillator signal from oscillator 215. The resulting detected signal is filtered by a band-pass filter 216 and demodulated by demodulator 218 at a rate between 2400 to 19.2K baud depending on channel selected. The demodulated signal is squared by comparator 220 and switched through microcontroller 226 for amplification by an RS-232 driver 222. Microcontroller 226 provides the signal to driver 232 during "on" periods and inhibits the signal during "off" periods. As a result, demodulator 204 provides the data modulated on the particular subchannel of the baseband signal as a data output via line 224.

The module 200 may also include a microcontroller 226 connected to receive digital instruction signals from the digital bus 70 via shift register 228. The digital instruction signals, in the form of a 16-bit data word, are provided by another module, such as a control module as illustrated in FIG. 4, to define operating parameters, such as frequency and baud rate of the DFSK oscillating data demodulator 204. Microcontroller 226 with SRAM 227 provides parameter control signals to synthesizer 206, demodulator 218 and driver 222 to control frequency selection by synthesizer 206 and baud rate selection by demodulation 218.

FIG. 3 illustrates an audio demodulator module 300 according to the invention. Analog bus 34 provides the baseband signal via line 302 to a mixer 304 which mixes the signal with a local oscillator signal provided by a frequency synthesizer for generating an IF signal from which the particular subchannel of the baseband signal can be detected. The mixed signal is provided to a selectable band-pass filter 308 which provides the filtered baseband signal to a discriminator 310 for detecting the FM subchannel signal. The discriminator 310 separates the signal into two separate signals. One signal is provided to selectable low-pass filter 312 and the filtered signal is expanded by 2:1 expander 314 to provide noise reduction. The expanded signal is deemphasized for 75 microseconds by deemphasis 316, such as a low-pass filter, resulting in an audio signal which is provided via normally closed squelch switch 318 to amplifier network 320. Various audio outputs are available from network 320, such as a high impedance monitor signal for input via a phono plug to a power amplifier, a low impedance 600 output signal for input to an amplifier for driving a plurality of speakers and a 2.5 watt rms amplified signal at 4 ohms impedance for directly driving a speaker.

The other separate signal from discriminator 310 is provided to a noise detector 322 which operates squelch switch 318. Noise detector 322 detects noise in the signal above the audio band, i.e., ultrasonic noise, rectifies the detected noise and compares it to a reference voltage. If the rectified noise is above the reference, squelch switch 318 is opened to inhibit the audio signal provided to the amplifier network 320.

In addition, the audio module 300 may include a 16 bit shift register 324 connected to the digital bus 70 for controlling the frequency synthesizer 306, selectable bandpass filter 308, selectable low-pass filter 312 and amplifier network 320. Each of these controllable components is preset to a default setting for receiving a particular subchannel. These settings can be altered by a controller module, as illustrated in FIG. 4, by providing a 16 bit word to register 324. Some bits of the word define the frequency of operation of the frequency synthesizer 306 and are provided thereto via line 326 upon latching of the register 324 by an enable signal provided via the digital bus 70. Similarly, a latched bit is provided via line 328 to bandpass filter 308 to control its bandwidth and is provided to low-pass filter 312 to control its bandwidth. Another latched bit is provided via line 330 to squelch switch 318 to open or close it depending on whether an audio output is desired. Two other bits are provided via line 332 to the amplifier network 320 to control the amplitude of the output signal. The network 320 is configured to provide two levels of boosted audio signals in response to these two other bits.

FIG. 4 illustrates a control module 400 according to the invention for controlling operation of the data module 200 and audio module 300. The baseband signal carried by analog bus 34 is provided via line 402 to DFSK data demodulator 404. One of the subchannels of the baseband signal includes control instructions which define the operation of the receiver Alternatively, the control instructions may be provided as data on top of an audio channel. For example, an audio channel may be configured to include audio information within 0–10 khz and control information within 10–20 khz. In this case, the control information would be stripped off the audio subchannel, such as by a band-pass filter, and then provided to demodulator 404. Demodulator 404 is tuned to the particular subchannel carrying the control instructions to demodulate the control instructions and provide them via line 406 to a microcontroller 408 providing a serial peripheral interface. Microcontroller 408, such as a Motorola MC68HC11A8 operating at 9600 baud, provides the control instructions as digital instruction signals to digital bus 70 thereby controlling the operation of any data modules and/or audio modules connected to the digital bus 70.

Microcontroller 408 employs static RAM 409 to provide a clock signal to the digital bus 70 for timing the shift registers. The data out provided by microcontroller 408 includes N+1 16 bit words, one for each of the registers of the N modules 36 plus one word for the shift register 45 controlling the channel selection. After the data words are transmitted via the digital bus 70 to the registers, the microcontroller 408 provides an enable signal to the digital bus to latch the data in the registers. Microcontroller 408 may also provide serial (RS232) and parallel outputs of the control instructions for monitoring by a computer. In general, control module 400 would be located in the first slot of the chassis, i.e., as channel A module 36A, to provide a serial chain of data words to the other modules and the register 45. However, it will be apparent to those skilled in the art that other configurations for providing communication between the control module 400 and the other modules and register 45 may be employed.

Figure 5:
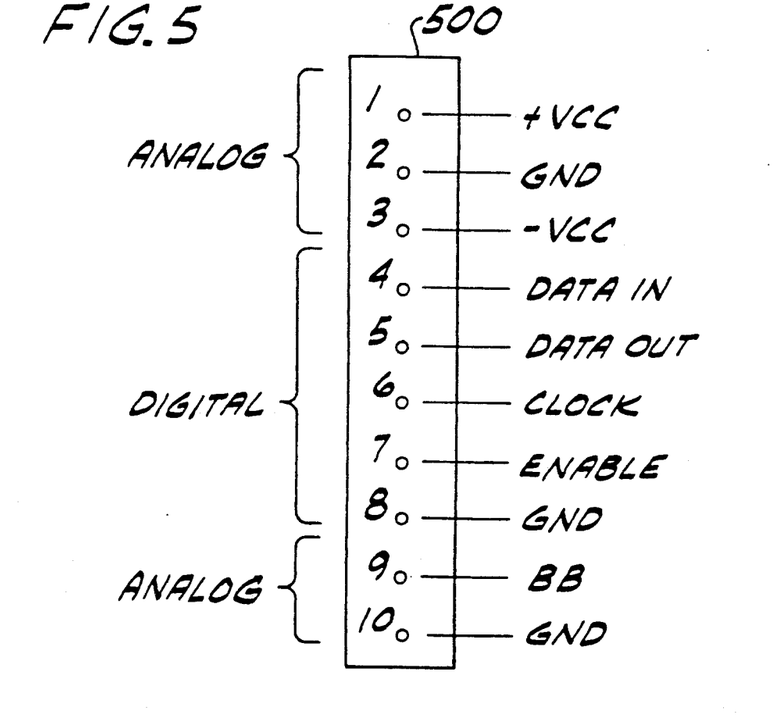
FIG. 5 is a schematic illustration of the combined analog/digital bus according to the invention.

Microcontroller 408 provides the data to the data in terminal 4 of bus 500 in the form of a binary code. The data is serially clocked through the register 45 and the registers of the modules 36 by the clock signal generated by microcontroller 408 via terminal 6 of bus 500. All registers including register 45, except for the last register of the last module 36N, receive more than one word in the serial string of data words. These registers receive the data works via the data in line connected to terminal 4 and pass the data to the subsequent register via the data out line connected to terminal 5. When each register contains its instructions, the registered are latched by the enable signal provided by microprocessor 408 via terminal 9 of bus 500.

FIG. 5 illustrates the configuration of the integral analog/digital bus 500 according to the invention. The bus 500 includes ten (10) terminals numbered 1–10. Each module 36 is connected to bus 500. Terminals 1-3, 9 and 10 comprise the analog portion of the bus. Terminals 1 and 3 carry the positive and negative power signals provided by power supply 38. Terminal 2 provides a power supply ground reference. Terminal 9 carries the baseband signal provided by demodulator 32. Terminal 10 provides a baseband ground reference. Terminals 4–8 comprise the digital portion of the bus. Terminals 4 and 5 carry the data to and from the register 45 and the registers of the modules 36, the data being provided by microcontroller 408. Terminals 6 and 7 carry the clock and enable signals, respectively, provided by microcontroller 408 for controlling register 45 and the registers of the modules 36. Terminal 8 provides a digital ground reference.

Figure 6:
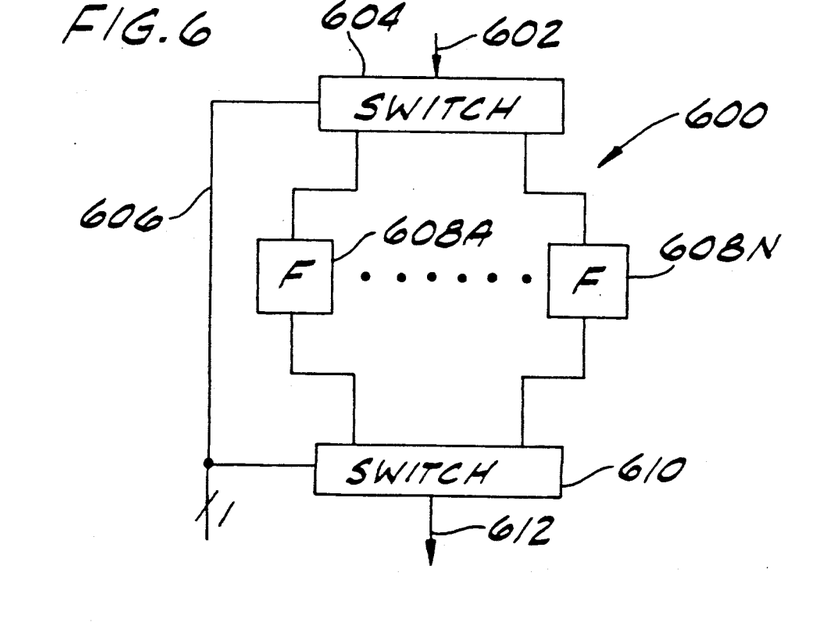
FIG. 6 is a block diagram of one embodiment of a filter having a selectable frequency range.

FIG. 6 illustrates a selectable filter 600 which may be employed as band-pass filter 26, band-pass filter 308 or low-pass filter 312. The signal to be filtered is provided via input line 602 to a switch 604 receiving a control signal via line 606 from the particular register or microcontroller controlling the filter 600. The control signal provided to switch 604 causes switch 604 to connect input line 602 to a particular one of the filters 608A–608N for receiving and filtering the baseband or IF signal. The particular filter which is selected depends on the parameters of the particular subchannel, i.e., on the bandwidth of the audio signal to be received and demodulated. Line 606 is also connected to switch 610 for connecting the output of the selected filter 608 to output line 612. Switch 610 is also responsive to the control signal. As a result, switches 604 and 610 isolate and connect the particular filter 608 which is selected. Other selectable filter configurations will be apparent to those skilled in the art.

In operation, the transmitter transmitting satellite signals to the receiver on the satellite network would control the receiver operation. A customer employing one of the receivers according to the invention would provide instructions to the operator of the transmitter specifying the particular channel and subchannels and times during which specified subchannels should be operational. The transmitter operator then modulates the control subchannel of the channel to which tuner 20 is tuned with the instructions as DFSK data. The channel signal including the control subchannel is then broadcast over the satellite network to the customer's parabolic reflector 10. The received baseband signal is carried by the analog bus 34 and includes all the subchannels, including the control subchannel, of the channel defined by the phase lock loop 44. The control module demodulates the control subchannel to obtain the instructions and provides the instructions to the digital bus 70 as binary coded signals. Each audio and data module connected to the digital bus 70, including register 45, then responds to its binary coded signals accordingly. For example, the control instructions may specify that an audio output is desired during the hours of 1:00 pm to 4:00 pm, that a data output is desired during the hours of 4:00 pm to 7:00 pm and that both audio and digital outputs are desired during the hours of 7:00 pm to 10:00 pm. Assume that the audio output results from a subchannel on a 0.100 mhz baseband carrier signal having a bandwidth of 15 khz and including audio information in the range of 0–20 khz. Also, assume the data output is on a 0.200 mhz baseband carrier signal at a baud rate of 2400. In the case of the audio module, processor 408 would address register 324 via digital bus 70 to turn on the FM discriminator 310 at 1:00 pm and to program its programmable frequency synthesizer 306 to generate a frequency for demodulating a 0.100 mhz subchannel. Processor 408 would also address register 306 to provide a BP (band-pass) control signal to filter 308 to select a band-pass having a bandwidth of 15 khz and to simultaneously provide an LP (low-pass) control signal to filter 314 to select a low-pass filter bandwidth of 0–20 khz. Processor 408 would turn off the FM discriminator 310 at 4:00 p.m., turn it on again at 7:00 p.m. and turn it off again a 10:00 p.m. As a result shift register 324, at the appropriate times, would control filters 308 and 312 to select the appropriate bandwidths depending on the particular subchannel of audio information which is to be detected. Similarly, processor 408 would address microcontroller 226 via digital bus 70 to define the particular baud rate, frequency and on/off operation of demodulator 204. Each controllable component has a default setting in the event that control data is not transmitted via the digital bus 70. For example, less expensive systems may not include a control module 400 and would operate only at default settings.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. An apparatus for receiving a selected channel of a signal having a plurality of channels, each channel having a plurality of subchannels, the apparatus comprising:
   means for receiving the signal;
   means for detecting the selected channel in the received signal and providing a detected signal corresponding to the selected channel;
   means for demodulating the detected signal into a baseband signal corresponding to the selected channel, the baseband signal being modulated with the subchannel of the selected channel;
   an analog bus connected to the demodulating means for providing the baseband signal;
   a first demodulator connected to the analog bus for demodulating a first subchannel of the subchannels of the baseband signal and providing a signal representative of the first subchannel;
   a second demodulator connected to the analog bus for demodulating a second subchannel of the subchannels of the baseband signal and providing a signal representative of the second subchannel; and
   a digital bus connected to the first and second demodulators.

2. The apparatus of claim 1 further comprising a power supply connected to the analog bus and wherein the analog bus carries power supply signals to the demodulating means and wherein the digital bus carries data in, data out, clock and enable signals to the demodulating means.

3. The apparatus of claim 1 wherein the first demodulator includes a first register, connected to the digital bus, for controlling the first demodulator and wherein the second demodulator includes a second register, connected to the digital bus, for controlling the second demodulator.

4. The apparatus of claim 3 further comprising a controller connected to the digital bus for addressing the first and second registers via the digital bus and for providing control data to the first and second registers via the digital bus, and a demodulating circuit connected to the analog bus for providing to the controller control signals modulated on the baseband signal.

5. The apparatus of claim 1 further comprising a controller connected to the digital bus for addressing the first and second demodulators via the digital bus and for providing control data to the first and second demodulators via the digital bus, and a demodulating circuit connected to the analog bus for providing to the controller control signals modulated on the baseband signal.

6. The apparatus of claim 1 further comprising a chassis connected to the analog and digital buses having a plurality of slots adapted to receive modules and wherein the first and second demodulators each comprises a module positioned in a slot in the chassis.

7. The apparatus of claim 1 wherein said means for detecting comprises a band-pass filter having at least two different selectable bandwidths and means, connected to the digital bus, for controlling the bandwidth of the band-pass filter; and further comprising a controller connected to the digital bus for addressing the bandwidth controlling means via the digital bus and for providing control data to the bandwidth controlling means via the digital bus, and a demodulating circuit connected to the analog bus for providing to the controller control signals modulated on the baseband signal.

8. The apparatus of claim 1 wherein said means for detecting comprises a band-pass filter having at least two different selectable bandwidths, said filter being preset to pass to the demodulating means only signals within a frequency range of the detected signal corresponding to the selected channel.

9. The apparatus of claim 1 wherein said means for detecting comprises a local oscillator generating a local oscillator signal for demodulating the received signal, a first reference oscillator generating a first reference signal, a first phase lock loop for adjusting the frequency of the local oscillator signal with respect to a phase difference between the first reference signal and the local oscillator signal, a second reference oscillator generating a second reference signal, and a second phase lock loop for adjusting the frequency of the first reference signal with respect to a phase difference between the second reference signal and the baseband signal.

10. The apparatus of claim 1 wherein the first signal representative of the first subchannel provided by the first demodulator comprises a data signal and the second signal representative of the second subchannel provided by the second demodulator comprises an audio signal.

11. The apparatus of claim 1 wherein said first demodulator further comprises a controller, responsive to the signal representative of the first subchannel, for controlling the operation of the second demodulator.

12. The apparatus of claim 11 wherein the controller controls baud rate and demodulating frequency of the second demodulator.

13. The apparatus of claim 1 wherein the first demodulator comprises a selectable band-pass filter connected to the analog bus and receiving the baseband signal, an FM demodulator for demodulating the signal provided by the bandpass filter, and a selectable low-pass filter for providing the demodulated signal as an output signal.

14. The apparatus of claim 13 further comprising a digital bus connected to the first and second demodulators and a register, connected to the digital bus, controlling the selectable band-pass filter, the selectable low-pass filter and demodulating frequency of the FM demodulator.

15. The apparatus of claim 1 wherein the digital bus connected to the first and second demodulators is integral with the analog bus.

16. An apparatus for receiving a selected channel of a signal having a plurality of channels, each channel having a plurality of subchannels, the apparatus comprising:
   means for receiving the signal;
   means for detecting the selected channel in the received signal and providing a detected signal corresponding to the selected channel;
   means for demodulating the detected signal into a baseband signal corresponding to the selected channel, the baseband signal being modulated with the subchannels of the selected channel;
   an analog bus connected to the demodulating means for providing the baseband signal; and
   a chassis connected to the analog bus and having a plurality of slots, each slot for receiving a module to which the baseband signal is supplied, each module for demodulating a subchannel of the baseband signal and providing a signal representative of the subchannel.

17. The apparatus of claim 16 further comprising an audio module positioned in one of the slots for demodulating a first subchannel of the baseband signal and providing an audio signal representative thereof.

18. The apparatus of claim 16 further comprising a data module positioned in one of the slots for demodulating a first subchannel of the baseband signal and providing a data signal representative thereof.

19. The apparatus of claim 18 further comprising an audio module positioned in one of the slots for demodulating a first subchannel of the baseband signal and providing an audio signal representative thereof.

20. The apparatus of claim 16 further comprising a controller for controlling operation of the means for detecting the selected channel and a demodulating circuit demodulating the baseband signal to provide to the controller control signals modulated on the baseband signal.

21. The apparatus of claim 16 further comprising a digital bus connected to the chassis and each of the modules located therein.

22. The apparatus of claim 21 further comprising a controller module positioned in one of the slots and at least one other module positioned in the other slots, said controller module for addressing the other modules via the digital bus and for providing control data to the other modules via the digital bus, and a demodulating circuit demodulating the baseband signal to provide to the controller module control signals modulated on the baseband signal.

23. The apparatus of claim 21 further comprising an audio module positioned in one of the slots for demodulating a first subchannel of the baseband signal and providing an audio signal representative thereof.

24. The apparatus of claim 21 further comprising a data module positioned in one of the slots for demodulating a first subchannel of the baseband signal and providing a data signal representative thereof.

25. The apparatus of claim 24 further comprising an audio module positioned in one of the slots for demodulating a first subchannel of the baseband signal and providing an audio signal representative thereof.

26. A module for use in combination with a receiver having a chassis connected to a digital bus for providing control information and connected to an analog bus providing baseband signal with a plurality of subchannels modulated thereon, said chassis having a plurality of slots, each slot for receiving one of the modules and for supplying a connection to the analog and digital buses, said module comprising:
- means for demodulating the baseband signal including means, responsive to the control information, for selectively controlling a bandwidth of the baseband signal being demodulated;
- means for engaging the analog bus via the slot and for providing the demodulated baseband signal to the demodulating means;
- means for engaging the digital bus via the slot; and
- means for supporting the demodulating means, the analog bus engaging means and the digital bus engaging means.

27. The module of claim 26 wherein the digital bus engaging means provides the control information to the means for controlling.

28. The module of claim 27 wherein the means for controlling controls the baud rate and demodulating frequency of the demodulating means.

29. The apparatus of claim 27 wherein the demodulating means comprises a band-pass filter, having selectable bandwidths, connected to the analog bus and receiving the baseband signal.

30. The apparatus of claim 29 wherein the means for controlling further comprises a register, connected to the digital bus, controlling the band-pass filter.

31. The apparatus of claim 27 wherein the demodulating means comprises a low-pass filter, having selectable bandwidths, connected to the analog bus and receiving the baseband signal, and wherein the means for controlling selects the bandwidth of the low-pass filter in response to the control information.

32. The apparatus of claim 31 wherein the means for controlling further comprises a register, connected to the digital bus, controlling the low-pass filter.

33. The apparatus of claim 27 wherein the demodulating means comprises a frequency synthesizer connected to the analog bus and providing a local oscillator signal of selectable frequency for demodulating the baseband signal, and wherein the means for controlling selects the frequency of the local oscillator signal in response to the control information.

34. The apparatus of claim 33 wherein the means for controlling further comprises a register, connected to the digital bus, controlling the frequency synthesizer.

* * * * *